United States Patent [19]

Griffith

[11] 4,435,686
[45] Mar. 6, 1984

[54] EXTENDED CASCODE AMPLIFIER

[76] Inventor: William F. Griffith, 920 Jefferson St., Apt. 3, Rochester, Ind. 46975

[21] Appl. No.: 267,341

[22] Filed: May 26, 1981

[51] Int. Cl.³ .............................................. H03F 1/00
[52] U.S. Cl. ..................................... 330/311; 330/165
[58] Field of Search ............... 330/112, 165, 166, 167, 330/171, 291, 311

[56] References Cited

FOREIGN PATENT DOCUMENTS 970614 9/1958 Fed. Rep. of Germany ...... 330/311

Primary Examiner—James B. Mullins
Assistant Examiner—Gene Wan
Attorney, Agent, or Firm—Wenderoth, Lind & Ponack

[57] ABSTRACT

Disclosed is a cascode amplifier circuit with improved current gain, linearity, overload performance and bandwidth which uses a step-down (of voltage) transformer between a driver stage and an output stage. One end of the primary of the transformer is connected to a driver transistor's collector and the other end is connected to the collector of a grounded-base output transistor. The transformer secondary is connected across the base and emitter of the output transistor. The transformer windings are phased such that a large driver current is forced through a high impedance, i.e. the primary winding impedance which is a multiple of the common base input impedance of the output transistor, resulting in power gain. The amplifier is capable of high maximum overloaded power output free of "break-up" of the waveform compared with conventional cascode operation, as well as greater power gain. By using transistors with high resistivity base material the amplifier operation is resistant to degradation by ionizing radiation and protected against secondary breakdown.

2 Claims, 5 Drawing Figures

EXTENDED CASCODE AMPLIFIER

BACKGROUND OF THE INVENTION

This invention relates to cascode amplifiers, and in particular what is termed herein an extended cascode amplifier.

Some early types (Circa 1961) of silicon transistors, e.g. General Electric type 4JX 10B513 NPN, exhibited, in common emitter configuration, unacceptably high saturation voltage (6 V at 0.5 A Ic). This was due to the use of base semiconductor material having a resistivity that was chosen to be much too high in aid of the primary objective of making transistors that would be much more thermally stable than previously used germanium transistors *in contemporary* (circa 1961) *design* circuits (common emitter).

The use of the common base configuration was the only obvious expedient to overcome the saturation voltage. In this mode of operation the swing of collector voltage along a power load line is able to reach all the way down to zero volts $V_c$ in contrast to saturation near five or six volts in the common emitter configuration. However, common base operation involves very low input impedance to the common base stage as well as an absence of current gain in the output stage.

The present invention enables the current gain to be augmented in the driver stage of a cascode by a step-down transformer, while preserving essentially the voltages at the input collector, the input stage base and the output collector substantially the same magnitudes they would have in a conventional cascode circuit, i.e. one having an interstage transformer with a turns ratio not substantially different from one-to-one.

SUMMARY OF THE INVENTION

An object of the invention is to provide a cascode type of amplifier having improved current gain while essentially preserving the voltage magnitudes of a conventional cascode amplifier circuit.

Another object of the invention is to provide a transistor amplifier capable of reasonably efficient operation in the presence of ionizing radiation. Briefly, the first object is achieved by providing a cascode amplifier circuit having a step-down (of voltage) transformer between a driver stage and an output stage. One end of the primary of the transformer is connected to an input (driver) transistor's collector and the other end is connected to the collector of a grounded-base output transistor. The transformer secondary is connected across the base and emitter of the output transistor. The transformer windings are phased such that a large driver current is forced through a high impedance, i.e. the primarywinding impedance which is a multiple of the common base input impedance of the output transistor, resulting in power gain augmentation (over all). The amplifier is capable of high maximum power output free of "break-up" of the waveform compared with conventional cascode operation, as well as greater power gain, while retaining "ballasting" in the power transition(s).

The second object may also be achieved by using transistors with high resistivity base material [i.e. ballasting]. [Ref. I.E.E.E. Society Circuits & Systems 1978 Symposium Record Transient Radiation Effects on Electronics of Aircraft Systems, T. J. Lambarski, pp. 119 to 123.] [Ref. R. J. Widlaz I.S.S.C.C. 1981 Paper WAM 3.5.]

DESCRIPTION OF THE PREFERRED EMBODIMENTS

Figure 1:
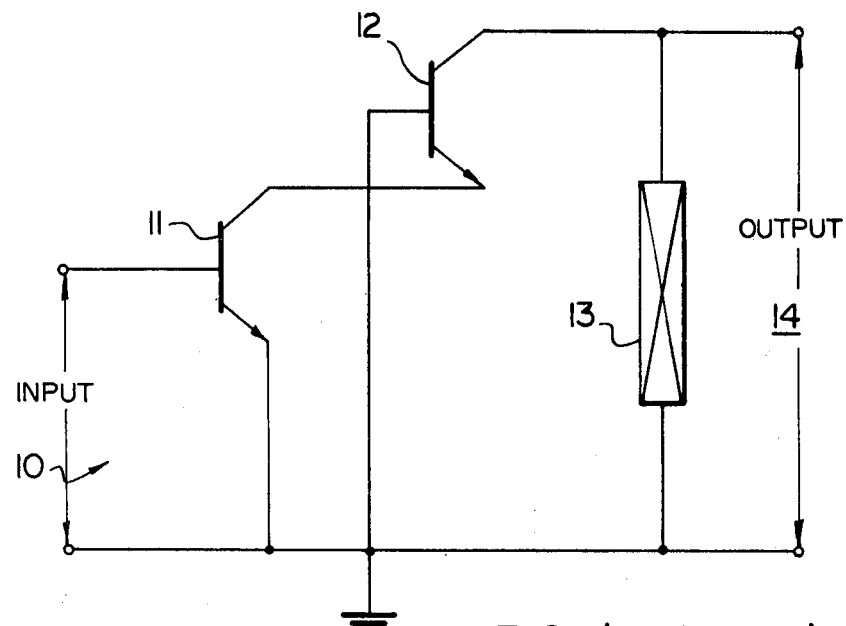
FIG. 1 is a simplified schematic of a conventional cascode amplifier.

FIG. 1 is presented merely to illustrate the basic configuration of a conventional cascode circuit. A signal at the input 10 feeds a grounded-emitter transistor 11 which, in turn, feeds a grounded-base transistor 12. The output 14 is taken across a load 13 connected between ground and the collector of output transistor 12. However, with this circuit configuration, the input impedance to transistor 12 is very low Ref. *Principles of Transistor Circuits,* Ed. by R. F. Shea Wiley, 1953, p. 207, etc. (increasing with freq.) and there is no current gain in the output stage.

Figure 2:
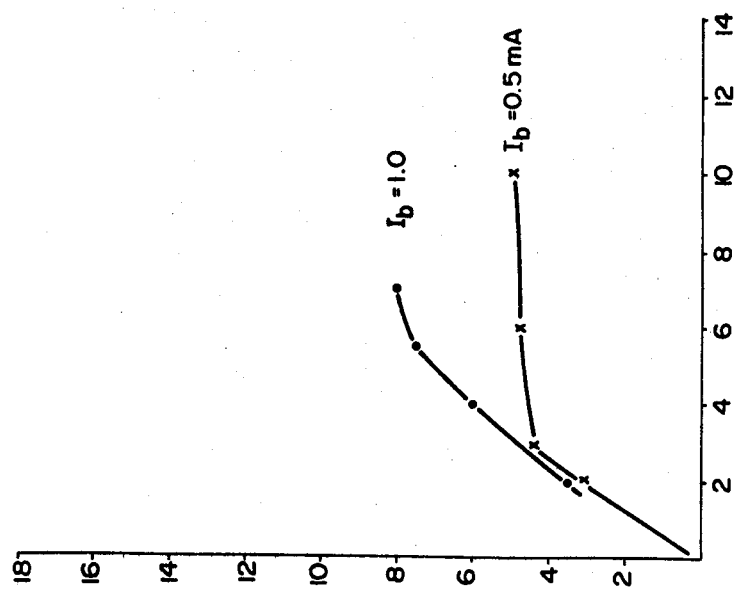
FIG. 2 comprises common emitter collector characteristic curves of a transistor having high base resistance, FIG. 3 comprises common base collector characteristics of a transistor having high base resistance (i.e. ballasting)

Early types of silicon transistors, such as General Electric type 4JX 10B513 NPN, were formed using base semi-conductor conductor material of high resistivity in aid of the (then) primary objective of making transistors that would be much more thermally stable (in contemporary state of the art circuits) than the hitherto used germanium transistors. However, as can be seen from FIG. 2, the common emitter collector characteristic curves for such transistors exhibited unacceptably high saturation voltage (6.0 V. at 0.5A.Ic) for use in common emitter mode. On the other hand, transistors with high resistivity base material are resistant to damage by ionizing radiation and it would be useful to use them for circuits requiring radiation hardening, e.g. in military and space applications.

Figure 3:
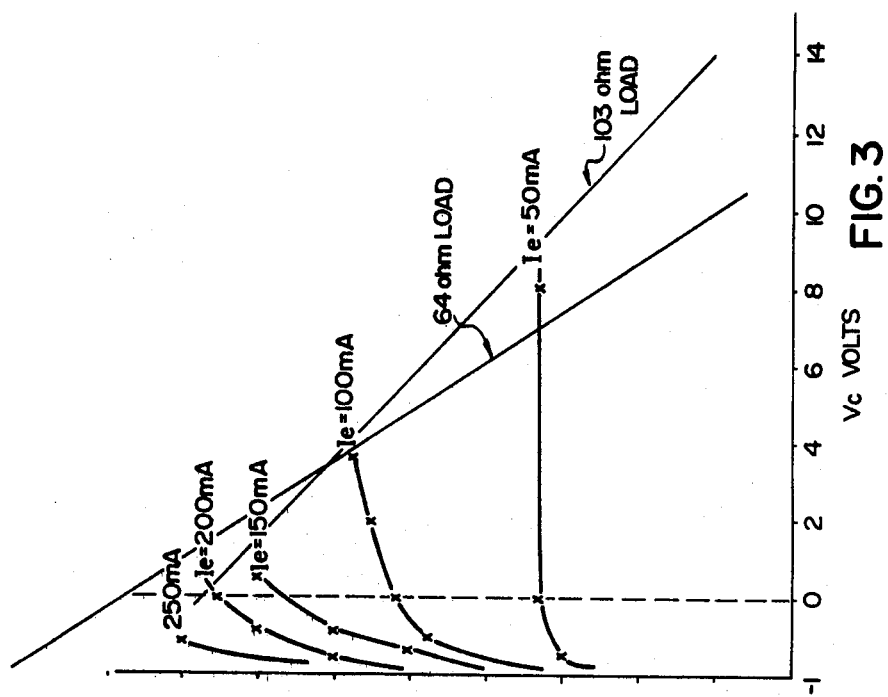

The use of the common base configuration was the only obvious expedient to overcome the saturation voltage problem discussed above. This is shown in FIG. 3 showing common base collector characteristics of the 4JX 10B 513 NPN. In this mode of operation the swing of collector voltage along a power load line is able to reach all the way down to zero volts $V_c$ in contrast to saturation near five or six volts with the common emitter mode. However, a disadvantage of common base operation is that it involves very low input impedance to the common base stage. Furthermore, there is no current gain in the output (usually power output stage).

The present invention enables the current gain to be augmented in the driver stage of a cascode by a step-down transformer, reducing the current and voltage levels in the driver by an order of magnitude while preserving essentially the voltages at the input collector, the input stage base and the output collector in the same magnitudes that they would have had in a cascode circuit. The invention also allows the use of high base resistivity transistors in the output resulting in a radiation hardened circuit and immunity to secondary breakdown.

Figure 4:
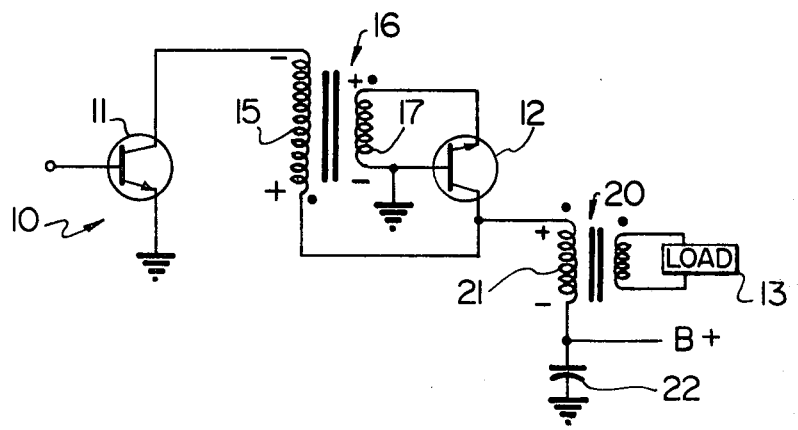
FIG. 4 is a schematic of an extended cascode amplifier circuit according to the invention.

Referring to FIG. 4, an extended cascode amplifier circuit according to the invention is shown wherein similar reference numerals are used for similar components as in FIG. 1. In this arrangement, the collector of driver transistor 11 is connected through the primary winding 15 of a transformer 16 to the collector of output transistor 12. The secondary winding 17 of transformer 16 is connected between the base and emitter of transistor 12. The load 13 is coupled to the collector of transistor 12 via a transformer 20 with B" for the transistors supplied through the primary 21 of transformer 20. A capacitor 22 isolates the B from ground while connecting AC through the primary 21 to ground.

The windings 15 and 17 of transformer 16 are phased in the manner shown so that a voltage rise at the collector of transistor 12 corresponds to a reduction of instantaneous signal current in the primary winding 15 of transformer 16. This results in instantaneous potentials with respect to ground at the collector of input transistor 11 equal in magnitude to the difference in the instantaneous magnitudes of the signal voltage across the primary winding and the output voltage. Another way of expressing this is to say that a large driver current is forced through a high impedance, namely the impedance of the primary winding 15 which is, in magnitude, a multiple of the common base input impedance of the output transistor 12 because of the turns ratio of transformer 16. The voltage drop in coil 15 is almost exactly compensated by the voltage rise in coil 21 (at choice of designer) so that the differences in these voltages, which is the voltage of the collector-emitter loop of transistor 11, can be chosen as desired, e.g. very small. By this means, a power gain is produced as compared to the power gain obtainable with the same transistors connected in conventional cascode fashion. Although the forcing of a large current through a high impedance (load impedance) is also a mechanism that is present in the conventional cascode, the driver has to supply, in that case, a current equal in magnitude to the output transistor emitter current.

The modification of cascode operating current in the input transistor that results from this "extended cascode" arrangement creates, around the output transistor common base stage, a positive voltage feedback proportional to the ratio:

$$\frac{\text{primary reflected impedance (of transformer 16)}}{\text{collector output impedance of input transistor plus primary reflected impedance}}$$

With input transistors having the commonly encountered pentode-like constant current static characteristic curves (common emitter), the denominator of the ratio is much larger than the numerator, so that one achieves what may be termed microscopic feedback with macroscopic effect, the principle "macroscopic" effect being a substantial increase in maximum overloaded output free of "break-up" of the waveform compared with conventional cascode operation, as well as greater power gain and better linearity below overload.

In known circuits the driver normally loses control when the input signal is at a high level and cuts off before the output transistor reaches maximum output. In other words, the driver ceases to be a driver on overload. In the present invention, the driver never loses control. The load line is at the choice of the circuit designer by changing the turn ratio of the interstage transformer 16. A positive load line should be selected. The driver transistor only makes small excursions even when the output transistor is clipping so that the maximum clipped output is much larger than with normal amplifiers. This is very useful for P.A. (Public Address) systems for good articulation of speech in high ambient noise conditions, e.g. [Designing for other than min. driver voltages, permits substantial driver current to be added to the output current.]

The transformer 16 is, for high frequency or wideband, a transmission line transformer, these being capable of wide bandwidth operation. These transformers, known per se, consist of transmission line (twisted pair, coaxial, or strip transmission line) wound on a high-permeability core such as ferrite or permalloy. (Ref. G. Guanella, Brown Bovert Review, Vol. 31, 1944, p. 327.)

Figure 5:
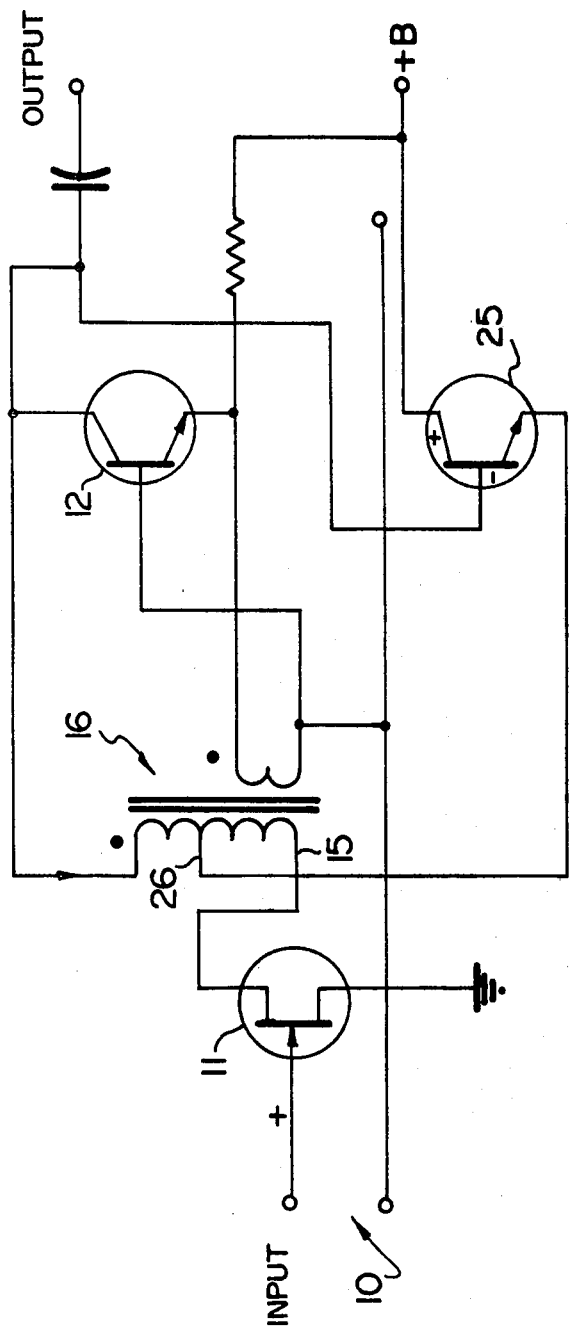
FIG. 5 is a schematic of a modified circuit according to the invention.

A modification of the amplifier according to the invention is shown in FIG. 5 in which the input transistor 11 is a field effect transistor and the output is push-pull transistor 25 having its emitter connected to a tap 26 on the primary winding 15 of transformer 16.

In FIG. 5 the transformer 16 may have, for example, a turns ratio of 10:1.

What is claimed is:

1. An extended cascode amplifier circuit comprising a driver transistor having a base, emitter and collector, the emitter being connected to ground, the base being connectable to a signal source and the collector being connected to one end of a primary winding of a transformer, the other end of the primary winding being connected to the collector of an output transistor, said output transistor having a base and an emitter, the base being connected to ground and, through a secondary winding of the transformer, to the emitter of said output transistor, the transformer windings being phased such that a large driver current is forced through a high impedance of the primary winding which is a multiple of the common base input impedance of the driver transistor.

2. An amplifier as claimed in claim 1, wherein said transistors have sufficiently high base resistance such that said transistors' saturation voltage is of the same order of magnitude as a supply voltage used for powering said amplifier circuit.

* * * * *